(12) United States Patent
La Rosa (10) Patent No.: US 6,724,243 B2
(45) Date of Patent: Apr. 20, 2004

(54) BIAS CIRCUIT WITH VOLTAGE AND TEMPERATURE STABLE OPERATING POINT

(75) Inventor: Francesco La Rosa, Rousset (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/164,840

(22) Filed: Jun. 6, 2002

(65) Prior Publication Data

US 2003/0001659 A1 Jan. 2, 2003

(30) Foreign Application Priority Data

Jun. 8, 2001 (FR) .............................. 01 07482

(51) Int. Cl.[7] .............................. G05F 1/10; G05F 3/02
(52) U.S. Cl. .................... 327/543; 327/541; 323/315
(58) Field of Search ................ 327/538, 540, 327/541, 543; 323/312, 315

(56) References Cited

U.S. PATENT DOCUMENTS

| 5,631,600 A | * | 5/1997 | Akioka et al. ............... 327/543 |
| 5,640,681 A | | 6/1997 | Barrett, Jr. et al. ........ 455/38.1 |
| 5,689,178 A | * | 11/1997 | Otake .......................... 323/282 |
| 5,825,236 A | | 10/1998 | Seevinck et al. ........... 327/538 |
| 5,961,215 A | * | 10/1999 | Lee et al. ..................... 374/178 |
| 6,002,276 A | | 12/1999 | Wu .............................. 327/66 |

FOREIGN PATENT DOCUMENTS

| JP | 59191629 A | * | 10/1984 | ............. G05F/1/56 |
| JP | 07200086 A | * | 8/1995 | ............. G05F/3/30 |

* cited by examiner

Primary Examiner—Terry D. Cunningham
Assistant Examiner—Quan Tra
(74) Attorney, Agent, or Firm—Lisa K. Jorgenson; Allen, Dyer, Doppelt, Milbrath & Gilchrist, P.A.

(57) ABSTRACT

A bias circuit integrated on a silicon wafer includes first, second and third branches. The first branch includes a first PMOS transistor in series with a first NMOS transistor. The second branch includes a second PMOS transistor, a second NMOS transistor and an electric resistor in series. The gate of the first NMOS transistor is connected to the gate of the second NMOS transistor. The first branch and the second branch are arranged as a current mirror. The third branch includes a third PMOS transistor in series with a third NMOS transistor. The third PMOS and NMOS transistors are arranged to maintain a drain voltage of the first PMOS transistor that is substantially identical to a drain voltage of the second PMOS transistor.

29 Claims, 5 Drawing Sheets

BIAS CIRCUIT WITH VOLTAGE AND TEMPERATURE STABLE OPERATING POINT

FIELD OF THE INVENTION

The present invention relates to integrated circuits, and in particular, to a bias circuit integrated on a silicon wafer.

BACKGROUND OF THE INVENTION

Figure 1:
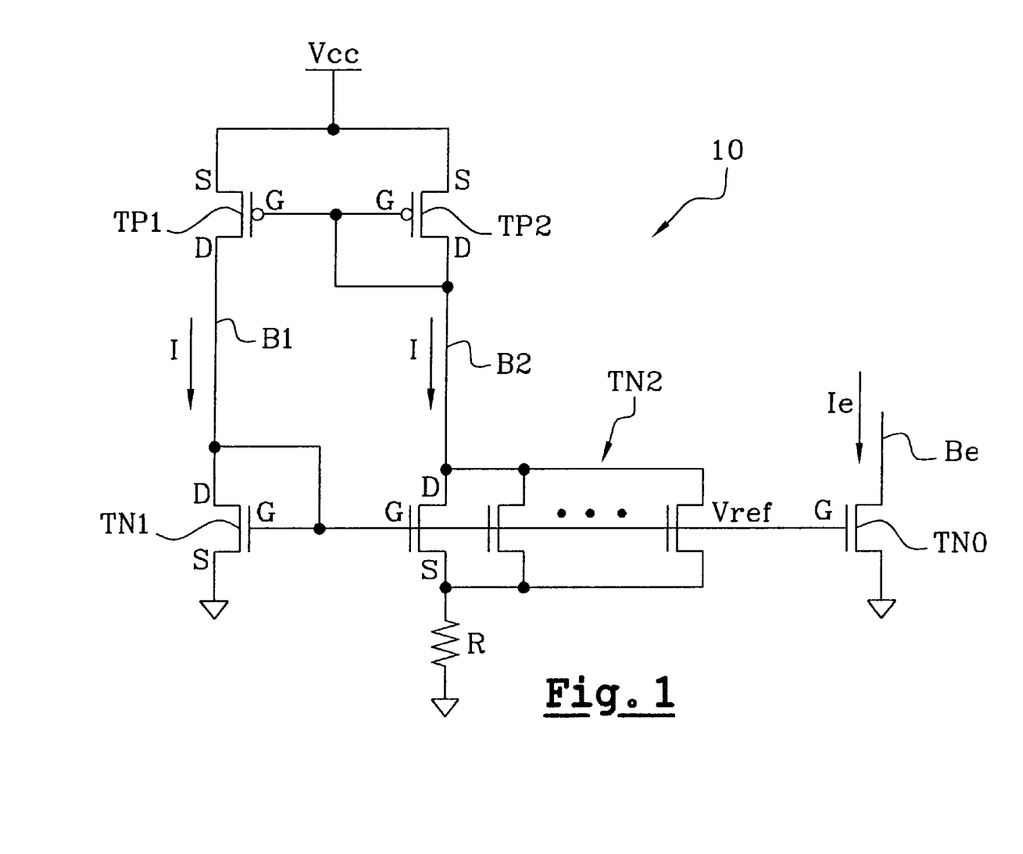
FIG. 1 is a schematic diagram of a bias circuit according to the prior art.

A bias circuit is often used in integrated circuits to apply a reference voltage to current generators or to voltage generators. A bias circuit 10 is shown in FIG. 1, and includes first and second branches B1, B2. The first branch B1 comprises a PMOS transistor TP1 and an NMOS transistor TN1 connected in series. The second branch B2 comprises a PMOS transistor TP2, an NMOS transistor TN2 and a resistor R connected in series. The transistor TN2 has a gate width to length ratio (W/L ratio) that is equal to N times that of the transistor TN1. This is generally achieved by NMOS transistors identical to the transistor TN1, arranged in parallel.

The branches B1, B2 are supplied by a voltage Vcc applied to the sources of the PMOS transistors, and are arranged as a current mirror. The gate G of the transistor TP2 is, for example, connected to the gate of the transistor TP2, which is also connected to its drain D. To ensure the self-bias of the circuit 10 at a determined operating point, the gate of the transistor TN2 is connected to the gate of the transistor TN1, which is connected to its drain. Therefore, after being activated, the bias circuit 10 is set to an operating point so that an identical current I passes through the branches B1, B2. This current I is assumed to be constant.

The bias circuit 10 shown in FIG. 1 may also be a current generator. A reference voltage Vref that is representative of the current I passing through the branches B1, B2 is sampled at one point of the circuit 10, for example, on the gate of the transistor TN1, and is applied to the gate of an external NMOS transistor TN0 arranged in an external branch Be. The transistor TN0 is identical to the transistor TN1, and provides a current Ie equal to the current I in the external branch Be. The transistor TN0 is therefore equivalent to a current generator inserted into the branch Be. Other current generators can be created in this way by applying the voltage Vref to other branches of an integrated circuit.

Figure 2:
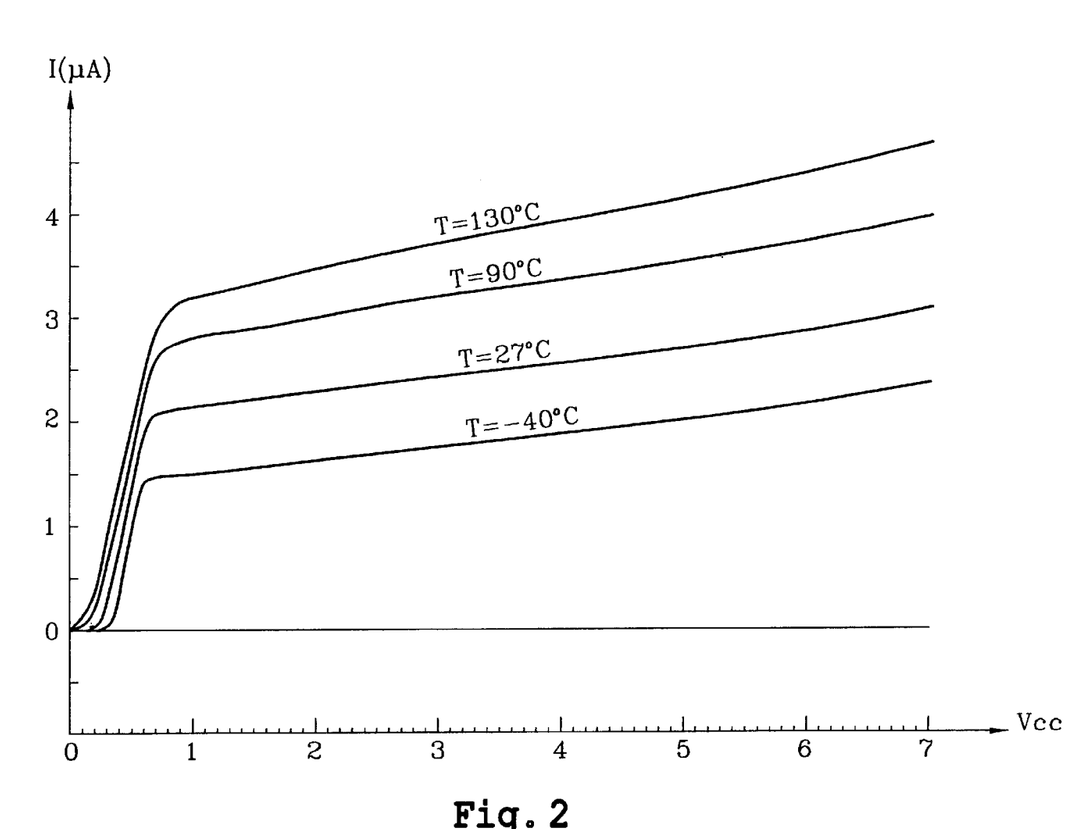
FIG. 2 is a graph of current/voltage curves of the bias circuit illustrated in FIG. 1.

This bias circuit 10 has the advantage of being very simple, and small in size in terms of the silicon surface occupied. However, it is sensitive to variations in the supply voltage Vcc or in the temperature. For a better understanding, FIG. 2 shows curves of the current/voltage of the bias circuit 10 as a function of the temperature T. The current I varies with the temperature for a given supply voltage Vcc. Furthermore, for a given temperature T, the current I rises when the voltage Vcc rises.

SUMMARY OF THE INVENTION

In view of the foregoing background, an object of the present invention is to overcome the above described voltage variation defects and temperature variation defects in a relatively straightforward manner without using complex stabilization circuits.

More particularly, an object of the present invention is to provide a bias circuit of the above-mentioned type that has a stable and constant current over a wide range of supply voltage values.

More particularly, another object of the present invention is to provide a bias circuit of the above-mentioned type that has a stable and constant current over a wide range of temperatures.

One of the objects of the present invention is achieved by providing a bias circuit integrated on a silicon wafer that includes a first branch and a second branch. The first branch comprises a first PMOS transistor in series with a first NMOS transistor. The second branch comprises a second PMOS transistor, a second NMOS transistor and a resistor all in series. The gate of the first NMOS transistor is connected to the gate of the second NMOS transistor. The first branch and the second branch are arranged as a current mirror. The bias circuit also includes a third branch comprising at least a third PMOS transistor in series with at least a third NMOS transistor. The third PMOS and NMOS transistors are arranged to maintain a voltage that is identical or roughly identical to the drain voltage of the first PMOS transistor and on the drain of the second PMOS transistor.

According to one embodiment, the gate of the third PMOS transistor is connected to the drain of the second PMOS transistor, and the gate of the third NMOS transistor is connected to the drain of the third NMOS transistor and to the gate of the first NMOS transistor. According to another embodiment, the drain of the first PMOS transistor is connected to the gate of the first PMOS transistor.

Another object of the present invention is achieved by providing a bias circuit of the type described above, in which the resistor has a temperature coefficient chosen so that the variations with the temperature ensure the stability of a current passing through the second branch.

According to one embodiment, the resistor comprises at least a first and a second resistor in series or in parallel. These resistors have distinct temperature coefficients. According to another embodiment, the first resistor is in N doped silicon and the second resistor is in $N^+$ or $P^+$ doped silicon.

According to one embodiment, the first branch comprises a fourth NMOS transistor arranged in series between the first PMOS transistor and the first NMOS transistor, and has a threshold voltage that is lower than that of the first NMOS transistor. The second branch comprises a fifth NMOS transistor arranged in series between the second PMOS transistor and the second NMOS transistor, and has a threshold voltage that is lower than that of the second NMOS transistor. The gates of the fourth and fifth NMOS transistors are connected to the gate of the first NMOS transistor.

According to another embodiment, the second NMOS transistor comprises a plurality of NMOS transistors in parallel. According to another embodiment, the bias circuit comprises an output delivering a reference voltage sampled on the gate of the first NMOS transistor. The output is connected to the gate of an external transistor arranged in an external branch.

According to one embodiment, the first and the second resistors have, at ambient temperature, values R10, R20, which meet the following equations: (1) $R10=R0(\alpha2-\alpha)/(\alpha2-\alpha1)$; and (2) $R20=R0(\alpha-\alpha1)/(\alpha2-\alpha1)$. R0 is the value of the resistor at ambient temperature, $\alpha1$ is the temperature coefficient of the first resistor, $\alpha2$ is the temperature coefficient of the second resistor, and $\alpha0$ is the temperature coefficient of the resistor ensuring the stability in temperature of the bias circuit.

BRIEF DESCRIPTION OF THE DRAWINGS

These and other objects, advantages and features of the present invention shall be presented in greater detail in the following description of two examples of bias circuit embodiments according to the present invention, given but not limited to, in relation with the following figures.

DETAILED DESCRIPTION OF THE PREFERRED EMBODIMENTS

As discussed above with respect to FIG. 2, the current I passing through the branches B1, B2 of the bias circuit shown in FIG. 1 rises with the supply voltage Vcc and varies with the temperature. The instability in voltage of the prior art bias circuit can be explained by an imbalance between the drain-source bias voltages of the transistors TP1, TP2 and by a channel length modulation effect in the transistors TP1, TP2 (rise in the current with the drain-source voltage), particularly in the transistor TP2, which effects the performances of the current mirror and causes an imbalance between the currents passing through the branches B1, B2.

Another cause of the voltage stability defect of the prior art bias circuit is an imbalance between the drain voltages of the transistors TN1, TN2. This leads to a difference in current due to the channel length modulation effect and/or to the existence of a substrate current that starts to appear when the drain-source voltage of the transistor TN2 is higher than a certain value. These various phenomena lead to a shift in the operating point of the bias circuit and effects its stability.

According to one aspect of the present invention, this inconvenience is overcome by adding a third branch to the prior art bias circuit comprising at least one PMOS transistor and one NMOS transistor connected to the other transistors of the bias circuit. This is done so as to provide voltages of the same value on the drains of transistors TP1 and TP2 so that they operate in the same drain-source bias conditions. An example of an embodiment of a bias circuit implementing this aspect of the invention will be described below.

Moreover, the temperature stability defect of the prior art bias circuit can be explained by the fact that a temperature variation leads to a variation in the electrical parameters of transistors TN1 and TN2, particularly their threshold voltages. This in turn leads to a variation in the voltage at the terminals of the resistor R.

According to another aspect of the present invention, this inconvenience is overcome by providing, in the branch B2, a resistor R having a temperature coefficient α chosen so that the variations in the value of the resistor R with the temperature offset the variations in the voltage at the terminals of the resistor and maintain the current I constant.

As the technological restrictions of integrated circuit manufacturing methods do not allow the temperature coefficient of a resistor to be adjusted, one idea of the present invention is to provide a resistor R of a composite type, formed by at least two distinct resistors having distinct temperature coefficients α1, α2. The combination of the two resistors form an equivalent resistor R having the temperature coefficient α required.

Figure 3:
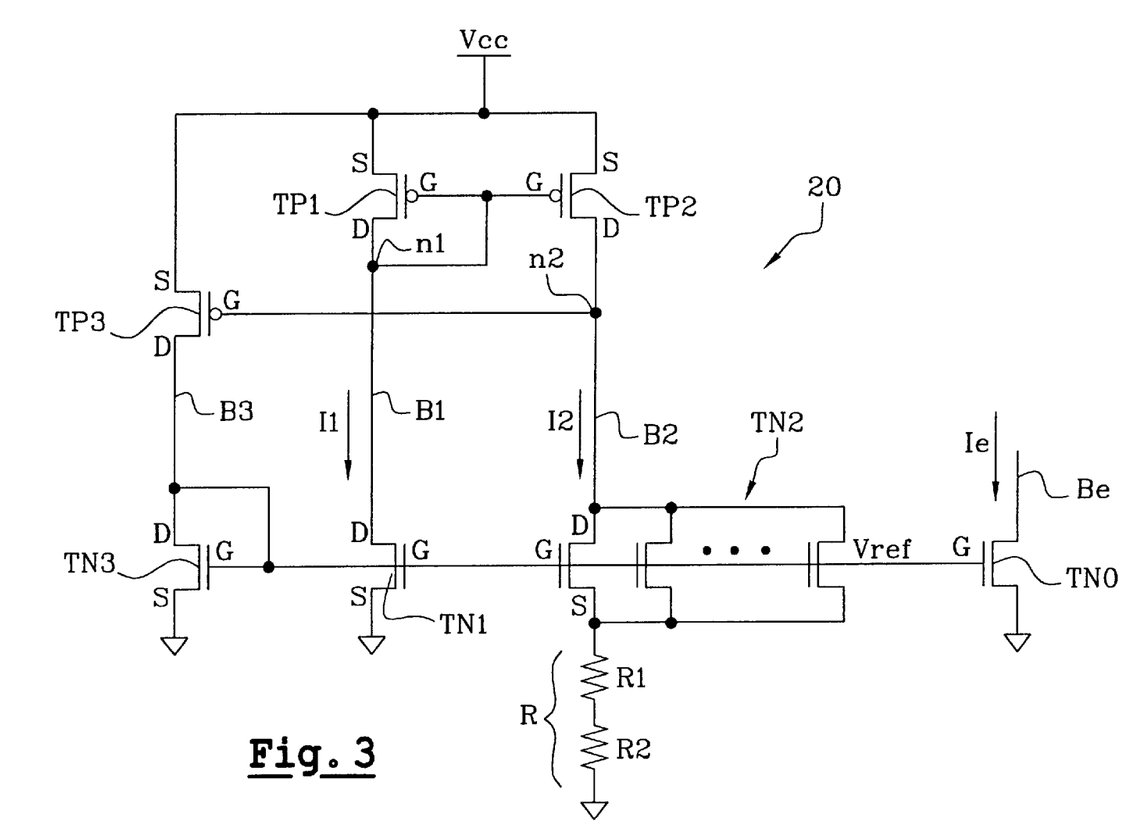
FIG. 3 is a schematic diagram of a first embodiment of a bias circuit according to the present invention.

FIG. 3 shows an embodiment of a bias circuit 20 implementing the two aspects of the present invention. The circuit 20 comprises, in a classical manner, a branch B1 comprising a PMOS transistor TP1 and an NMOS transistor TN1, and a branch B2 comprising a PMOS transistor TP2, an NMOS transistor TN2 and a resistor R in series. These components are designated by the same references as in FIG. 1.

The supply voltage Vcc is applied to the source S of the transistor TP1, the drain D of which is connected to the drain of the transistor TN1. The source of the transistor TN1 is connected to ground. The voltage Vcc is also applied to the source S of the transistor TP2, the drain D of which is connected to the drain of the transistor TN2. The source of the transistor TN2 is linked to ground through the resistor R. The gates of transistors TN1, TN2 are interconnected. The transistor TN2 is formed by a plurality of transistors in parallel that are identical to the transistor TN1, and therefore has a W/L ratio (gate width to length) equal to N times that of the transistor TN1. The transistors TP1, TP2 are identical, i.e., the same W/L ratio.

The current mirror between the two branches B1, B2 is obtained by connecting the gate of the transistor TP2 to the gate of the transistor TP1, and by connecting the gate of the transistor TP1 to the drain of this transistor.

According to the first aspect of the present invention, the circuit 20 comprises a third branch B3 comprising a PMOS transistor TP3 and an NMOS transistor TN3 in series. The source of the transistor TP3 receives the voltage Vcc. The drain of the transistor TP3 is connected to the drain of the transistor TN3, the source of which is connected to ground. The transistor TN3 has its gate connected to its drain, and to the gates of transistors TN1, TN2. The transistor TN3 is identical to the transistor TN1 (same W/L ratio) and the transistor TP3 is identical to the transistors TP1, TP2.

According to the second aspect of the present invention, the resistor R is a composite resistor formed by two resistors in series R1 and R2, respectively having temperature coefficients α1 and α2. The values of the resistors R1 and R2 are determined as follows:

1) When the circuit 20 is designed, the value R0 of the resistor R at standard ambient temperature, which is generally 27° C., is first determined in a readily known manner.

2) Once the resistor R0 is known, a temperature coefficient α of the resistor R is sought for which the circuit 20 does not have any thermal drift. The coefficient α can be determined experimentally, by trial and error and successive approaches using simulation software on the operation of the circuit 20, without the need to proceed with theoretical calculations. This method of determining the coefficient α requires a few tens of minutes of work, and requires the testing of four or five different values of the coefficient α, thus allowing the value sought to be rapidly found.

3) When the coefficient α has been determined, two different materials are then chosen to produce the resistors R1 and R2 having temperature coefficients α1, α2 that are known and are respectively higher and lower than the temperature coefficient α. The resistor R1 is, for example, an N-well resistor, i.e., made of N-doped silicon, having a high temperature coefficient, for example, on the order of $5 \times 10^{-3}$ Ω/° C. The resistor R2 is, for example, an N+ or P+ diffusion resistor, in N+ or P+ silicon obtained by diffusion of dopants, having a low temperature coefficient, for example, on the order of $1 \times 10^{-3}$ Ω/° C.

4) At the end of these preparatory stages, the value R0 of the resistor R at ambient temperature is known and the temperature coefficients α, α1, α2 are known. Thus, the following known relations are considered, which give the values of resistors R, R1, R2 as a function of the temperature:

$$R=R0(1+\alpha*\Delta T) \quad (1)$$

$$R1=R10(1+\alpha1*\Delta T) \quad (2)$$

$$R2=R20(1+\alpha2*\Delta T) \quad (3)$$

ΔT is a temperature variation in relation to the standard ambient temperature, and R10 and R20 are the values of R1 and R2 at standard ambient temperature.

As the resistors R1 and R2 are arranged in series (an arrangement in parallel can be considered but makes the calculations more complex) the result is:

$$R=R1+R2 \quad (4)$$

$$R0=R10+R20 \quad (4)\Rightarrow(5)$$

$$R10=R0-R20 \quad (5)\Rightarrow(6)$$

$$R20=R0-R10 \quad (5)\Rightarrow(7)$$

By combining (1), (2), (3) and (4) the result is:

$$R0+R0*\alpha\Delta T=R10+R10*\alpha1*\Delta T+R20+R20*\alpha2*\Delta T \quad (8)$$

By combining (5) and (8) the result is:

$$R0*\alpha=R10*\alpha1+R20*\alpha2 \quad (9)$$

By combining (7) and (9) and by combining (6) and (9), the result is:

$$R10=R0(\alpha2-\alpha)/(\alpha2-\alpha1) \quad (10)$$

$$R20=R0(\alpha-\alpha1)/(\alpha2-\alpha1) \quad (11)$$

Therefore, the relations (10) and (11) allow the values R10, R20 of resistors R1, R2 to be determined using the known value R0. The coefficient α is found by trial and error, and by electrical simulation, and by using the coefficients α1, α2 of the materials used to produce resistors R1, R2.

The operation of the circuit 20 at ambient temperature is similar to that of the prior art circuit 10. The branch B3 ensures the self-bias of the circuit 20 at an operating point where the branches B1, B2 are passed through by identical currents I1, I2. To obtain a source of current from the circuit 20, an output voltage Vref is sampled, for example, on the gate of the transistor TN1, and is applied to an external NMOS transistor TN0 arranged in an external branch Be. The transistor TN0 imposes a current Ie equal to the current I1 in the branch Be if this transistor is chosen to be identical to the transistor TN1.

When the temperature rises, the value of the resistor R varies, and therefore maintains the current I2 constant in the branch B2. The current I1 in the branch B1 is identical to the current I2. The current Ie in the external branch Be remains constant.

When the voltage Vcc rises and the current I2 tends to drop compared to the current I1 due to the channel modulation effect in the transistor TP2, the drain voltage of the transistor TP2, present on a node n2, tends to rise. As the voltage at the node n2 is applied to the gate of the transistor TP3, the latter tends to conduct less current and the drain voltage of the transistor TP3 tends to rise, such that the gate voltage of the transistors TN3, TN1 and TN2 also rises. The transistors TN1 and TN2 tend to conduct more current which causes the drain voltage of the transistor TP1, present on a node n1, to rise.

Therefore, when the voltage Vcc rises, the branches B1 and B3 are passed through by the same current, and the transistor TP3 imposes a drain voltage (node n1) on the transistor TP1 that is identical to the drain voltage of the transistor TP2 (node n2). As the transistors TP1, TP2 receive the same voltage Vcc at their source, the drain-source voltages of these two transistors are therefore monitored and are maintained identical.

It will be understood that the bias circuit 20 according to the present invention is susceptible to different variations and improvements. In particular, one residual inconvenience of the circuit 20 is that the transistors TN1 and TN2, which are not identical, are not biased in the same conditions due to the fact that the source of the transistor TN2 is linked to ground through the resistor R. Therefore, when the voltage Vcc is high, the transistors TN1, TN2 are likely not to have the same variation of drain current for the same variation of drain voltage. This is due to different substrate currents, which may unbalance the bias circuit.

Figure 4:
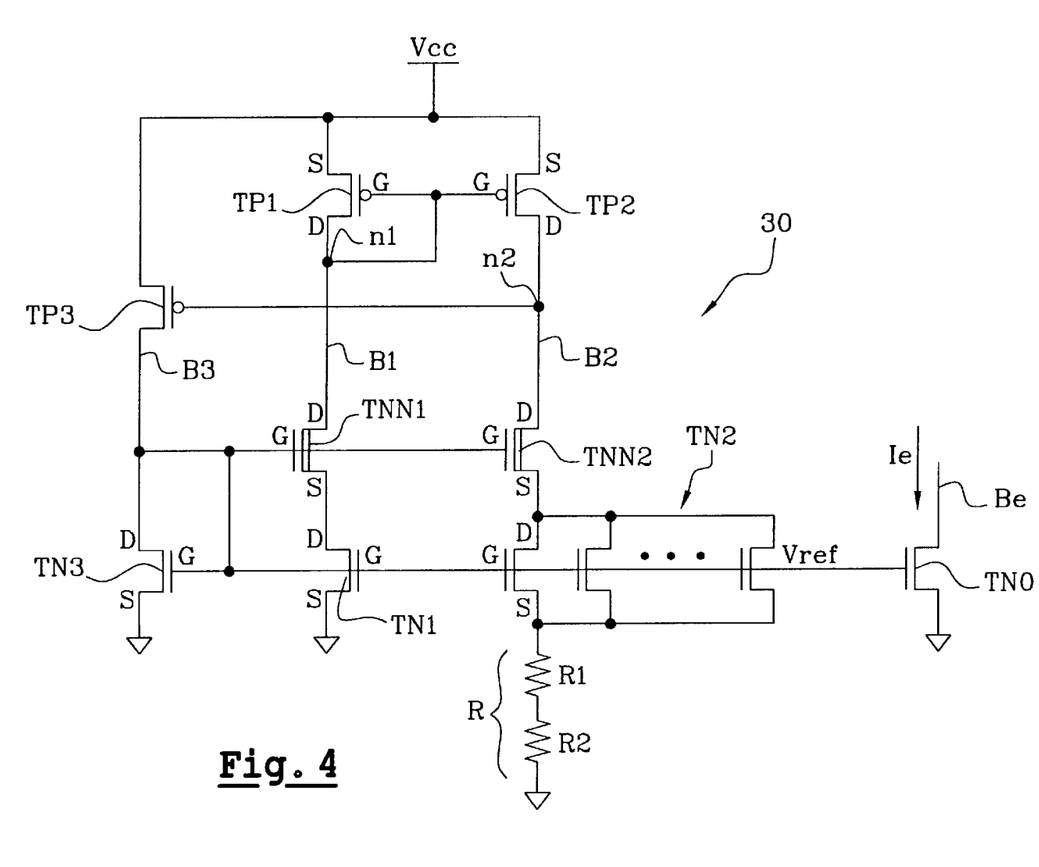
FIG. 4 is a schematic diagram of a second embodiment of a bias circuit according to the present invention.

FIG. 4 shows a bias circuit 30 according to the present invention in which the possible differences in drain currents of transistors TN1, TN2 are removed. The circuit 30 differs from the circuit 20 by the fact that two NMOS transistors TNN1, TNN2 are inserted into the branches B1 and B2. The transistor TNN1 has its drain connected to the drain of the transistor TP1, and its source is connected to the drain of the transistor TN1. The transistor TNN2 has its drain connected to the drain of the transistor TP2, and its source is connected to the drain of the transistor TN2. The gates of transistors TNN1, TNN2 are connected to the gates of transistors TN1, TN2.

The transistors TNN1, TNN2 are identical and have a low threshold voltage Vtn, which is lower than the threshold voltage Vt of transistors TN1, TN2. The transistors TNN1, TNN2 are, for example, native transistors (with undoped channel) having a threshold voltage Vtn on the order of 0.4 V, compared to 1 V for the threshold voltage Vt of transistors TN1, TN2, which are enhancement transistors.

As the gates of transistors TN1, TN2 are linked to the gates of transistors TNN1, TNN2, the drain voltage $V_D$ of transistors TN1, TN2 is equal to:

$$V_D = Vg - Vtn \quad (12)$$

Vg is the gate voltage of transistors TN1, TN2.

As the threshold voltage Vtn of transistors TNN1, TNN2 is lower than the threshold voltage Vt of transistors TN1, TN2, the drain voltage $V_D$ of transistors TN1, TN2 is higher than the difference between the gate voltage Vg and the threshold voltage Vt:

$$V_D = Vg - Vtn > Vg - Vt \quad (13)$$

such that the transistors TN1, TN2 operate in a saturation mode (drain-source current relatively insensitive to the variations in the drain-source voltage).

The advantage of this embodiment is that the transistors TN1, TN2 have a drain voltage $V_D$ that is monitored by the transistors TNN1, TNN2, that no longer depends on the voltage Vcc, as the variations in the voltage Vcc are absorbed by the drain of transistors TNN1, TNN2. Moreover, the presence of the transistors TNN1, TNN2 does not change the operating point of the circuit 30, which is identical to that of the circuit 20, as the transistors TN1, TN2 operate in the saturation mode.

Figure 5:
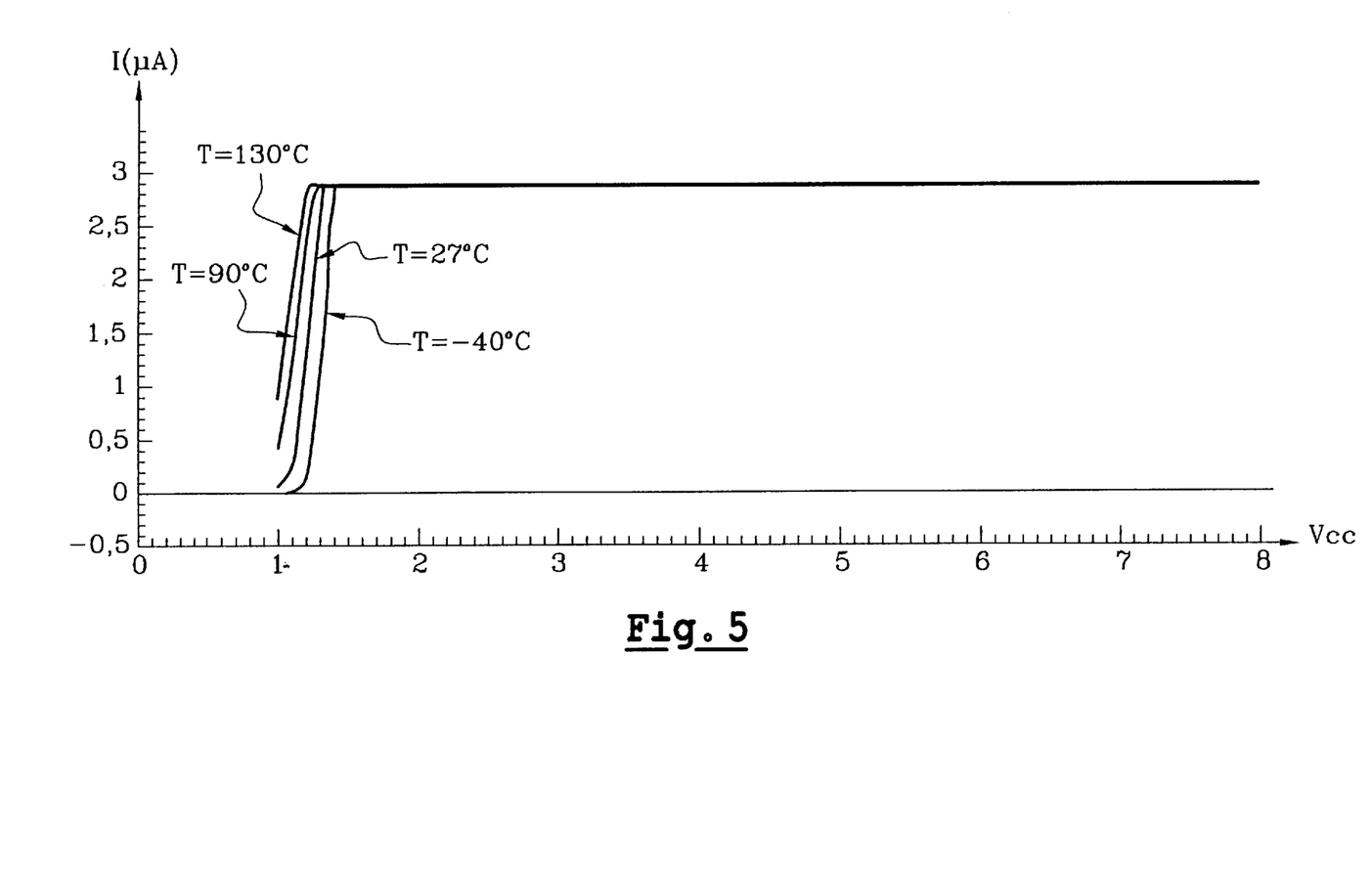
FIG. 5 is a graph of current/voltage curves of a bias circuit according to the present invention.

As the drain voltage of transistors TN1, TN2 is maintained at a low and stable value, independent of the voltage Vcc, the substrate current in the transistors TN1, TN2 is negligible. Consequently, the circuit 30, despite being relatively straightforward, has remarkable operating stability over a wide range of temperatures and voltage Vcc values, as shown by the current/voltage curves in FIG. 5.

As a numerical example, a bias circuit according to the present invention having a nominal current I1 on the order of 2.9 µA has very low current I1 fluctuations, ranging between 2.874 µA and 2.902 µA, over a range of values of the voltage Vcc from 1.5 V to 8V and a range of temperatures from −40° C. to +130° C. There is a negligible variation of the nominal current, which is on the order of 0.5%.

That which is claimed is:

1. A bias circuit comprising:
   a semiconductor substrate;
   a first branch on said semiconductor substrate and comprising a first PMOS transistor and a first NMOS transistor connected in series therewith, said first PMOS transistor comprising a gate and a drain, and said first NMOS transistor comprising a gate;
   a second branch on said semiconductor substrate and connected to said first branch for forming a current mirror, said second branch comprising a second PMOS transistor, at least one second NMOS transistor connected in series therewith, and a resistive element connected in series with said at least one second NMOS transistor, said second PMOS transistor comprising a gate and a drain, and said at least one second NMOS transistor comprising a gate connected to the gate of said first NMOS transistor, said resistive element having a temperature coefficient so that a resistive value thereof remains stable during temperature variations so that a current passing through said second branch is relatively stable; and
   a third branch on said semiconductor substrate and comprising a third PMOS transistor and a third NMOS transistor connected thereto, said third branch being connected to said first and second branches for maintaining a voltage on the drain of said first PMOS transistor that is substantially equal to a voltage on the drain of said second PMOS transistor.

2. A bias circuit according to claim 1, wherein said third PMOS transistor comprises a gate connected to the drain of said second PMOS transistor; and wherein said third NMOS transistor comprises a gate and a drain connected together and the gate is connected to the gate of said first NMOS transistor.

3. A bias circuit according to claim 2, wherein the gate and drain of said first PMOS transistor are connected together.

4. A bias circuit according to claim 1, wherein said resistive element comprises a first resistor and a second resistor connected together, said first resistor having a first temperature coefficient and said second resistor having a second temperature coefficient different from the first temperature coefficient.

5. A bias circuit according to claim 4, wherein said first and second resistors are series-connected or parallel-connected.

6. A bias circuit according to claim 4, wherein said first resistor comprises an N-doped silicon resistor, and said second resistor comprises an N$^+$ or P$^+$ doped silicon resistor.

7. A bias circuit according to claim 4, wherein said first and second resistors have, at ambient temperature, resistive values R10 and R20, which meet the following equations:

$$R10=R0(\alpha 2-\alpha)/(\alpha 2-\alpha 1), \qquad (1)$$

and $$R20=R0(\alpha-\alpha 1)/(\alpha 2-\alpha 1), \qquad (2)$$

R0 is a value of said resistive element at ambient temperature, α1 is a temperature coefficient of said first resistor, and α2 is a temperature coefficient of said second resistor, and α0 is a temperature coefficient of said resistive element.

8. A bias circuit according to claim 1, wherein said first branch further comprises a fourth NMOS transistor connected in series between said first PMOS transistor and said first NMOS transistor, said fourth NMOS transistor having a threshold lower than a threshold of said first NMOS transistor; wherein said second branch further comprises a fifth NMOS transistor connected in series between said second PMOS transistor and said at least one second NMOS transistor, said fifth NMOS transistor having a threshold lower than a threshold of said at least one second NMOS transistor; and wherein said fourth and fifth NMOS transistors each comprise a gate connected to the gate of said first NMOS transistor.

9. A bias circuit according to claim 1, wherein said at least one second NMOS transistor comprises a plurality of parallel-connected second NMOS transistors.

10. A bias circuit according to claim 1, wherein a reference voltage on the gate of said first NMOS transistor is applied to an external transistor in an external branch connected to said second branch.

11. A bias circuit comprising:
    a semiconductor substrate;
    a first branch on said semiconductor substrate and comprising a first transistor of a first conductivity type and a first transistor of a second conductivity type connected in series therewith, said first transistor of the first conductivity type comprising a control terminal and a conducting terminal, and said first transistor of the second conductivity type comprising a control terminal;
    a second branch on said semiconductor substrate and connected to said first branch for forming a current mirror, said second branch comprising a second transistor of the first conductivity type, at least one second transistor of the second conductivity type connected in series therewith, and a resistive element connected in series with said at least one second transistor of the second conductivity type, said second transistor of the first conductivity type comprising a control terminal and a conducting terminal, and said at least one second transistor of the second conductivity type comprising a control terminal connected to the control terminal of said first transistor of the second conductivity type, said resistive element having a temperature coefficient so that a resistive value thereof remains stable during temperature variations so that a current passing through said second branch is relatively stable; and
    a third branch on said semiconductor substrate and comprising a third transistor of the first conductivity type and a third transistor of the second conductivity type connected thereto, said third branch being connected to said first and second branches for maintaining a voltage on the conducting terminal of said first transistor of the first conductivity type that is substantially equal to a voltage on the conducting terminal of said second transistor of the first conductivity type.

12. A bias circuit according to claim 11, wherein said first, second and third transistors comprise a MOS transistor; and wherein the first conductivity type comprises a p-type conductivity so that a corresponding MOS transistor is a PMOS transistor, and the second conductivity type comprises an n-type conductivity so that a corresponding MOS transistor is an NMOS transistor.

13. A bias circuit according to claim 12, wherein the control terminal comprises a gate, and the conducting terminal comprises a drain.

14. A bias circuit according to claim 11, wherein said third transistor of the first conductivity type comprises a control terminal connected to the conducting terminal of said second transistor of the first conductivity type; and wherein said third transistor of the second conductivity type comprises a control terminal and a conducting terminal connected together and the control terminal is connected to the control terminal of said first transistor of the second conductivity type.

15. A bias circuit according to claim 14, wherein the control terminal and conducting terminal of said first transistor of the first conductivity type are connected together.

16. A bias circuit according to claim 11, wherein said resistive element comprises a first resistor and a second resistor connected together, said first resistor having a first temperature coefficient and said second resistor having a second temperature coefficient different from the first temperature coefficient.

17. A bias circuit according to claim 16, wherein said first and second resistors have, at ambient temperature, resistive values R10 and R20, which meet the following equations:

$$R10 = R0(\alpha 2 - \alpha)/(\alpha 2 - \alpha 1), \quad (1)$$

and $$R20 = R0(\alpha - \alpha 1)/(\alpha 2 - \alpha 1), \quad (2)$$

R0 is a value of said resistive element at ambient temperature, $\alpha 1$ is a temperature coefficient of said first resistor, $\alpha 2$ is a temperature coefficient of said second resistor, and $\alpha 0$ is a temperature coefficient of said resistive element.

18. A bias circuit according to claim 11, wherein said first branch further comprises a fourth transistor of the second conductivity type connected in series between said first transistor of the first conductivity type and said first transistor of the second conductivity type, said fourth transistor of the second conductivity type having a threshold lower than a threshold of said first transistor of the second conductivity type; wherein said second branch further comprises a fifth transistor of the second conductivity type connected in series between said second transistor of the first conductivity type and said at least one second transistor of the second conductivity type, said fifth transistor of the second conductivity type having a threshold lower than a threshold of said at least one second transistor of the second conductivity type; and wherein said fourth and fifth transistors of the second conductivity type each comprise a control terminal connected to the control terminal of said first transistor of the second conductivity type.

19. A bias circuit according to claim 11, wherein said at least one second transistor of the second conductivity type comprises a plurality of parallel-connected second transistors of the second conductivity type.

20. A bias circuit according to claim 11, wherein a reference voltage on the control terminal of said first transistor of the second conductivity type is applied to an external transistor in an external branch connected to said second branch.

21. A method for making a bias circuit comprising:
forming a first branch on a semiconductor substrate comprising a first transistor of a first conductivity type and a first transistor of a second conductivity type connected in series therewith, the first transistor of the first conductivity type comprising a control terminal and a conducting terminal, and the first transistor of the second conductivity type comprising a control terminal;

forming a second branch on the semiconductor substrate connected to the first branch for forming a current mirror, the second branch comprising a second transistor of the first conductivity type, at least one second transistor of the second conductivity type connected in series therewith, and a resistive element connected in series with the at least one second transistor of the second conductivity type, the second transistor of the first conductivity type comprising a control terminal and a conducting terminal, and the at least one second transistor of the second conductivity type comprising a control terminal connected to the control terminal of the first transistor of the second conductivity type, the resistive element having a temperature coefficient so that a resistive value thereof remains stable during temperature variations so that a current passing through the second branch is relatively stable; and forming a third branch on the semiconductor substrate and comprising a third transistor of the first conductivity type and a third transistor of the second conductivity type connected thereto, the third branch being connected to the first and second branches for maintaining a voltage on the conducting terminal of the first transistor of the first conductivity type that is substantially equal to a voltage on the conducting terminal of the second transistor of the first conductivity type.

22. A method according to claim 21, wherein the first, second and third transistors comprise a MOS transistor; and wherein the first conductivity type comprises a p-type conductivity so that a corresponding MOS transistor is a PMOS transistor, and the second conductivity type comprises an n-type conductivity so that a corresponding MOS transistor is an NMOS transistor.

23. A method according to claim 22, wherein the control terminal comprises a gate, and the conducting terminal comprises a drain.

24. A method according to claim 21, wherein the third transistor of the first conductivity type comprises a control terminal connected to the conducting terminal of the second transistor of the first conductivity type; and wherein the third transistor of the second conductivity type comprises a control terminal and a conducting terminal connected together and the control terminal is connected to the control terminal of the first transistor of the second conductivity type.

25. A method according to claim 24, wherein the control terminal and conducting terminal of the first transistor of the first conductivity type are connected together.

26. A method according to claim 21, wherein the resistive element comprises a first resistor and a second resistor connected together, the first resistor having a first temperature coefficient and the second resistor having a second temperature coefficient different from the first temperature coefficient.

27. A method circuit according to claim 21, wherein the first branch further comprises a fourth transistor of the second conductivity type connected in series between the first transistor of the first conductivity type and the first transistor of the second conductivity type, the fourth transistor of the second conductivity type having a threshold lower than a threshold of the first transistor of the second conductivity type; wherein the second branch further comprises a fifth transistor of the second conductivity type connected in series between the second transistor of the first conductivity type and the at least one second transistor of the second conductivity type, the fifth transistor of the second conductivity type having a threshold lower than a threshold of the at least one second transistor of the second conductivity type; and wherein the fourth and fifth transistors of the second conductivity type each comprise a control terminal connected to the control terminal of the first transistor of the second conductivity type.

28. A method according to claim 21, wherein the at least one second transistor of the second conductivity type comprises a plurality of parallel-connected transistors of the second conductivity type.

29. A method according to claim 21, wherein a reference voltage on the control terminal of the first transistor of the second conductivity type is applied to an external transistor in an external branch connected to the second branch.

* * * * *

UNITED STATES PATENT AND TRADEMARK OFFICE
CERTIFICATE OF CORRECTION

PATENT NO. : 6,724,243 B2
DATED : April 20, 2004
INVENTOR(S) : Francesco La Rosa It is certified that error appears in the above-identified patent and that said Letters Patent is hereby corrected as shown below:

<u>Column 5,</u>
Line 18, Equation (4), delete "R-R1+R2" and insert -- R=R1+R2 --
Line 28, Equation (8), delete "$R0 + R0*\alpha\Delta T = R10 + R10*\alpha 1*\Delta T + R20 + R20*\alpha 2*\Delta T$" and insert -- $R0 + R0*\alpha*\Delta T = R10 + R10*\alpha 1*\Delta T + R20 + R20*\alpha 2*\Delta T$ --

Signed and Sealed this

Twenty-seventh Day of July, 2004

JON W. DUDAS
*Acting Director of the United States Patent and Trademark Office*